(12) United States Patent
Guo et al.

(10) Patent No.: US 12,249,494 B2
(45) Date of Patent: *Mar. 11, 2025

(54) REMOTE PLASMA CLEANING OF CHAMBERS FOR ELECTRONICS MANUFACTURING SYSTEMS

(71) Applicant: Applied Materials, Inc., Santa Clara, CA (US)

(72) Inventors: Yuanhong Guo, Mountain View, CA (US); Sheng Guo, Santa Clara, CA (US); Marek Radko, San Jose, CA (US); Steve Sansoni, Livermore, CA (US); Xiaoxiong Yuan, San Jose, CA (US); See-Eng Phan, Santa Clara, CA (US); Yuji Murayama, Los Gatos, CA (US); Pingping Gou, San Mateo, CA (US); Song-Moon Suh, Seoul (KR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/500,951

(22) Filed: Nov. 2, 2023

(65) Prior Publication Data

US 2024/0062999 A1    Feb. 22, 2024

Related U.S. Application Data

(63) Continuation of application No. 17/214,707, filed on Mar. 26, 2021, now Pat. No. 11,854,773.

(Continued)

(51) Int. Cl.
*H01J 37/32*    (2006.01)

(52) U.S. Cl.
CPC .. *H01J 37/32825* (2013.01); *H01J 37/32357* (2013.01); *H01J 37/32449* (2013.01); *H01J 37/32889* (2013.01)

(58) Field of Classification Search
CPC ........... H01J 37/32357; H01J 37/32449; H01J 37/32825; H01J 37/32862; H01J 37/32889
See application file for complete search history.

(56) References Cited

U.S. PATENT DOCUMENTS

| 4,842,687 A | 6/1989 | Jucha et al. |
| 5,138,973 A | 8/1992 | Davis et al. |

(Continued)

FOREIGN PATENT DOCUMENTS

| JP | 2014165169 A | 9/2014 |
| JP | 2018187623 A | 11/2018 |

(Continued)

OTHER PUBLICATIONS

International Search Report and Written Opinion for International Application No. PCT/US2021/024835, dated Jul. 19, 2021, 10 Pages.

*Primary Examiner* — Tung X Le
(74) *Attorney, Agent, or Firm* — Lowenstein Sandler LLP (57) ABSTRACT

A method of cleaning a chamber for an electronics manufacturing system includes flowing a gas mixture comprising oxygen and a carrier gas into a remote plasma generator. The method further includes generating a plasma from the gas mixture by the remote plasma generator and performing a remote plasma cleaning of the chamber by flowing the plasma into an interior of the chamber, wherein the plasma removes a plurality of organic contaminants from the chamber.

20 Claims, 9 Drawing Sheets

Related U.S. Application Data

(60) Provisional application No. 63/002,994, filed on Mar. 31, 2020.

(56) References Cited

U.S. PATENT DOCUMENTS

| | | | |
|---|---|---|---|
| 5,248,636 A * | 9/1993 | Davis | C23C 16/517 |
| | | | 438/711 |
| 7,159,597 B2 | 1/2007 | Hua et al. | |
| 10,269,540 B1 | 4/2019 | Carter et al. | |
| 2002/0020429 A1 | 2/2002 | Selbrede et al. | |
| 2006/0027249 A1 | 2/2006 | Johnson et al. | |
| 2009/0139453 A1 | 6/2009 | Chen et al. | |
| 2009/0246399 A1 | 10/2009 | Goundar et al. | |
| 2010/0089423 A1 * | 4/2010 | Iijima | H01J 37/32862 |
| | | | 134/22.1 |
| 2010/0098882 A1 | 4/2010 | Lubomirsky et al. | |
| 2014/0263272 A1 | 9/2014 | Duan et al. | |
| 2015/0037972 A1 * | 2/2015 | Danek | H01L 21/76814 |
| | | | 438/618 |
| 2015/0107618 A1 | 4/2015 | Sun et al. | |
| 2015/0255259 A1 | 9/2015 | Li et al. | |
| 2016/0042958 A1 * | 2/2016 | Nishide | C23C 16/45523 |
| | | | 118/719 |
| 2018/0211824 A1 | 7/2018 | Kudo et al. | |
| 2018/0366339 A1 | 12/2018 | Peng et al. | |
| 2019/0333741 A1 | 10/2019 | Nagami et al. | |

FOREIGN PATENT DOCUMENTS

| | | |
|---|---|---|
| JP | 2019516856 A | 6/2019 |
| WO | 2005095670 A2 | 10/2005 |
| WO | 2019057310 A1 | 3/2019 |

* cited by examiner

REMOTE PLASMA CLEANING OF CHAMBERS FOR ELECTRONICS MANUFACTURING SYSTEMS

RELATED APPLICATIONS

This patent application is a continuation of U.S. application Ser. No. 17/214,707, filed Mar. 26, 2021, which claims the benefit under 35 U.S.C. § 119(e) of U.S. Provisional Application No. 63/002,994, filed Mar. 31, 2020, each of which are incorporated by reference herein.

TECHNICAL FIELD

Embodiments of the present disclosure relate, in general, to methods and systems for cleaning chambers and components of an electronics manufacturing system, and in particular to remote plasma cleaning of chambers of an electronics manufacturing system.

BACKGROUND

An electronics manufacturing system generally includes multiple chambers (e.g., transfer chambers, load lock chambers, processing chambers, etc.) that are subject to vacuum during operation. During manufacturing of the chambers, organic contaminants and/or airborne molecular contaminants (AMCs) are introduced into various components of the chambers. Such organic contaminants may be introduced by handling of the components, machining of the components, packaging of the components, sealant, lubricant, and/or various other sources. When the chambers are initially used under vacuum at a manufacturing site, the organic contaminants deposit onto substrates that are placed within, processed by and/or moved through the chambers. Traditionally, the chambers are cleaned at a manufacturing site prior to use of the chambers by wiping the chambers with isopropyl alcohol (IPA). However, the IPA wipe cleaning technique does not remove all of the organic contaminants, and does not prevent the organic contaminants from depositing onto substrates.

SUMMARY

Some of the embodiments described cover a method of performing a remote plasma cleaning of a chamber for an electronics manufacturing system. One or more components of the chamber for the electronics manufacturing system are machined. The chamber is then assembled using the one or more components, wherein after assembly the chamber comprises a plurality of organic contaminants. A gas mixture comprising oxygen and a carrier gas is flowed into a remote plasma generator connected to the chamber. The remote plasma generator generates a plasma from the gas mixture. Remote plasma cleaning of the chamber is performed by flowing the plasma into an interior of the chamber, wherein the plasma removes the plurality of organic contaminants from the chamber.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments described herein are related to methods and systems for cleaning chambers of an electronics manufacturing system using a remote plasma cleaning process. The various chambers of an electronics manufacturing system generally include organic contaminants and/or airborne molecular contaminants (AMCs) after being machined and assembled. The organic contaminants may include hydrocarbons-based organic contaminants, aromatic-based organic contaminants and/or ester-based organic contaminants, for example. These organic contaminants may have been introduced into various components of the chambers by handling of the components, machining of the components, and packaging of the components. Additionally, the components may include sealant, lubricant, and/or other products that contribute organic contaminants. When the chambers are initially used under vacuum, the organic contaminants deposit onto substrates that are placed within, processed by and/or moved through the chambers. Traditional techniques for cleaning the chamber(s) of electronics manufacturing systems prior to first use on product substrate have been found to be insufficient to adequately remove organic contamination. Additionally, traditional techniques for cleaning the chamber(s) of electronics processing systems can take multiple days to weeks, which increases a cost of ownership of the electronics manufacturing systems.

In an example traditional technique to clean a chamber of an electronics processing system prior to first use, the chamber is subject to a wet clean in which the interior of the chamber is wiped down with IPA. After such an IPA wipe, a test is often run to determine an amount of organic contamination on substrates placed into the chamber under vacuum. If the level of organic contamination exceeds a threshold, then tests may be performed to identify a possible source of the organic contamination, and the components that are then identified as the possible sources of organic contamination may be replaced. This process can take one or more weeks, and is often ineffective. Another standard technique to prepare a new electronics processing system for use is to perform wafer cycling of the chambers of the electronics processing system along with residual gas analyzer (RGA) monitoring of outgassing, which can take weeks to perform, is expensive, and which also may fail to reduce the organic contamination effectively.

Embodiments set forth a remote plasma cleaning process to clean one or more chambers of an electronics processing system. A gas mixture including oxygen and a carrier gas is flowed into a remote plasma system (RPS, also referred to herein as a remote plasma generator). The remote plasma system generates a plasma from the gas mixture, and delivers the plasma into one or more chambers of the electronics processing system. In one embodiment, the interior of the one or more chambers are heated when the plasma is delivered so that organic contaminants and/or airborne molecular contaminants (AMCs) inside the chambers begin to evaporate. The remote plasma reacts with the organic contaminants and/or AMCs in the interior of the chamber(s), and the reactants are pumped out of the chamber(s). The remote plasma cleaning process described in embodiments has been tested on multiple different chambers, and testing has shown the process to effectively eliminate all or nearly all of organic contaminants and/or AMCs in the interior of the chambers. The remote plasma cleaning process also can be performed over a period of less than half a day, significantly reducing the amount of time that it takes to bring a new electronics processing system online as compared to conventional techniques for cleaning and/or otherwise preparing a new electronics manufacturing system for use on product. For example, the time to qualify a new electronics manufacturing system (or a chamber thereof) can be reduced from multiple days or weeks down to a day or less. Additionally, the cost of performing the remote plasma cleaning process is significantly lower than the cost of performing wafer cycling and the cost of replacing components of a chamber. Accordingly, the remote plasma cleaning process described in embodiments herein is more efficient and more robust than conventional cleaning and qualification techniques for new electronics manufacturing systems.

The remote plasma cleaning process described herein can be performed on any sealed or sealable chamber, and provides particular benefits for chambers that will be subject to vacuum conditions during operation. Examples of such chambers include load lock chambers, transfer chambers, factory interfaces, enclosed alignment stations, vias, buffers, purge chambers, and process chambers such as physical vapor deposition (PVD) process chambers, chemical vapor deposition (CVD) process chambers, etch process chambers, and atomic layer deposition (ALD) process chambers. The remote plasma cleaning process may also be performed on other assemblies with enclosed interior volumes that are used in device manufacturing to remove organic contaminants and/or AMCs. One example of such an assembly with an enclosed interior volume is a substrate carrier such as a front opening unified pod (FOUP) or a side storage pod (SSP). Accordingly, it should be understood that embodiments discussed herein with reference to performing plasma cleaning of chambers also apply to performing plasma cleaning of other assemblies having enclosed volumes.

Figure 1:
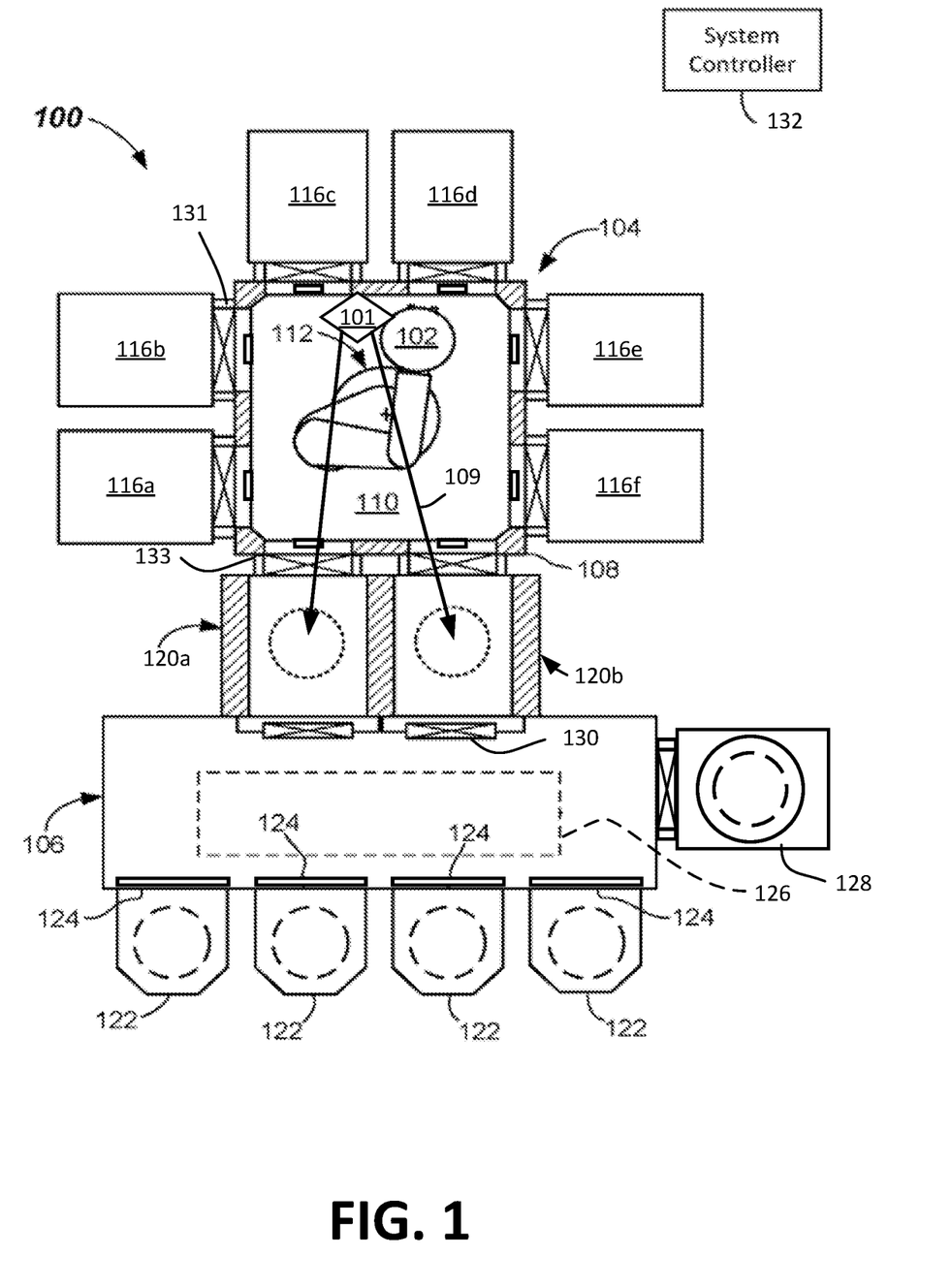
FIG. 1 is a top schematic view of an example electronics manufacturing system undergoing a remote plasma cleaning process, according to aspects of the present disclosure.

FIG. 1 is a top schematic view of an example electronics manufacturing system 100, according to one aspect of the disclosure. Electronics manufacturing system 100 may perform one or more processes on a substrate 102. Substrate 102 may be any suitably rigid, fixed-dimension, planar article, such as, e.g., a silicon-containing disc or wafer, a patterned wafer, a glass plate, or the like, suitable for fabricating electronic devices or circuit components thereon.

Electronics manufacturing system 100 may include a mainframe 104 and a factory interface 106 coupled to mainframe 104. Mainframe 104 may include a housing 108 having a transfer chamber 110 therein. Transfer chamber 110 may include one or more processing chambers (also referred to as process chambers) 116a-116f disposed therearound and coupled thereto. Processing chambers 116a-116f may be coupled to transfer chamber 110 through respective ports 131, which may include slit valves or the like.

Note that an approximately square shaped mainframe having four sides (also referred to as facets) is shown, with multiple processing chambers connected to each facet. However, it should be understood that a facet may include a single processing chamber or more than two processing chambers coupled thereto. Additionally, the mainframe 104 may have other shapes, such as a rectangular shape (in which different facets may have different lengths) or a radial shape with more than four facets (e.g., with five, six, or more facets).

Processing chambers 116a-116f may be adapted to carry out any number of processes on substrates 102. One or more of the processing chambers 116a-116f in one embodiment are configured to be operated under vacuum conditions (e.g., pressures of less than 1 ATM, pressures of less than 100 mTorr, etc.). A same or different substrate process may take place in each processing chamber 116a-116f. A substrate process may include atomic layer deposition (ALD), physical vapor deposition (PVD), chemical vapor deposition (CVD), etching, annealing, curing, pre-cleaning, metal or metal oxide removal, or the like. In one example, a PVD process may be performed in one or both of process chambers 116a-116b, an etching process may be performed in one or both of process chambers 116c, 116d, and an annealing process may be performed in one or both of process chambers 116e, 116f. Other processes may be carried out on substrates therein. Processing chambers 116a-116f may each include a substrate support assembly. The substrate support assembly may be configured to hold a substrate in place while a substrate process is performed.

Transfer chamber 110 may also include a transfer chamber robot 112. Transfer chamber robot 112 may include one or multiple robot arms where each robot arm includes one or more end effectors (also referred to herein as blades) at the end of the robot arm. The end effector may be configured to handle particular objects, such as wafers. Alternatively, or additionally, the end effector may be configured to handle objects such as process kit rings. In some embodiments, transfer chamber robot 112 may be a selective compliance assembly robot arm (SCARA) robot, such as a 2 link SCARA robot, a 3 link SCARA robot, a 4 link SCARA robot, and so on. The transfer chamber 110 in one embodiment is configured to be operated under vacuum conditions (e.g., pressures of less than 1 ATM, pressures of less than 100 mTorr, etc.)

One or more load locks 120a, 120b (also referred to as load lock chambers) may also be coupled to housing 108 and transfer chamber 110. Load locks 120a, 120b may be configured to interface with, and be coupled to, transfer chamber 110 on one side and factory interface 106 on another side. Load locks 120a, 120b may have an environmentally-controlled atmosphere that may be changed from a vacuum environment (wherein substrates may be transferred to and from transfer chamber 110) to an at or near atmospheric-pressure (e.g., with inert-gas) environment (wherein substrates may be transferred to and from factory interface 106) in some embodiments.

In some embodiments, ports 131 and/or slit values are at interfaces between processing chambers 116a-116f and transfer chamber 110. In embodiments, ports 133 and/or slit valves separate the transfer chamber 110 from the load locks 120a, 120b.

Factory interface (FI) 106 may be any suitable enclosure, such as, e.g., an Equipment Front End Module (EFEM). Factory interface 106 may be configured to receive substrates 102 from substrate carriers 122 (e.g., Front Opening Unified Pods (FOUPs)) docked at various load ports 124 of factory interface 106. A factory interface robot 126 (shown dotted) may be configured to transfer substrates 102 between substrate carriers (also referred to as containers) 122 and load lock 120. Factory interface robot 126 may include one or more robot arms and may be or include a SCARA robot. Factory interface robot 126 may include an end effector on an end of each robot arm. The end effector may be configured to pick up and handle specific objects, such as wafers. Alternatively, or additionally, the end effector may be configured to handle objects such as process kit rings.

Any conventional robot type may be used for factory interface robot 126. Transfers may be carried out in any order or direction. Factory interface 106 may be maintained in, e.g., a slightly positive-pressure non-reactive gas environment (using, e.g., nitrogen as the non-reactive gas) in some embodiments.

In some embodiments, a side storage pod (SSP, not shown) is coupled to the FI 106.

In some embodiments, transfer chamber 110, process chambers 116a-116f, and load locks 120a, 120b may be maintained at a vacuum level. Electronics manufacturing system 100 may include one or more ports 130, 131, 133 (e.g., vacuum ports) that are coupled to one or more stations of electronics manufacturing system 100. For example, ports 130 (e.g., vacuum ports) may couple factory interface 106 to load locks 120. Additional ports 133 (e.g., vacuum ports) may be coupled to load locks 120 and disposed between load locks 120 and transfer chamber 110, as discussed above. Each of the ports 130, 133, 131 may include slit valves that separate a vacuum environment from a higher pressure (e.g., atmospheric pressure) environment.

In some embodiments, an aligner station 128 is coupled to FI 106. Alternatively, aligner station 128 may be housed in FI 106. A port separates aligner station 128 from the FI 106 in some embodiments. Aligner station 128 is configured to align substrates, fixtures, and/or other objects (e.g., process kit rings) to a target orientation.

Electronics manufacturing system 100 may also include a system controller 132. System controller 132 may be and/or include a computing device such as a personal computer, a server computer, a programmable logic controller (PLC), a microcontroller, and so on. System controller 132 may include one or more processing devices, which may be general-purpose processing devices such as a microprocessor, central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device may also be one or more special-purpose processing devices such as an application specific integrated circuit (ASIC), a field programmable gate array (FPGA), a digital signal processor (DSP), network processor, or the like. System controller 132 may include a data storage device (e.g., one or more disk drives and/or solid state drives), a main memory, a static memory, a network interface, and/or other components. System controller 132 may execute instructions to perform any one or more of the methodologies and/or embodiments described herein. The instructions may be stored on a computer readable storage medium, which may include the main memory, static memory, secondary storage and/or processing device (during execution of the instructions). System controller 132 may also be configured to permit entry and display of data, operating commands, and the like by a human operator.

The electronics manufacturing system 100 (or one or more chambers thereof) may be cleaned using a remote plasma cleaning process in embodiments after assembly of the electronics manufacturing system 100. Alternatively, one or more chambers of the electronics manufacturing system 100 may be assembled and cleaned prior to an entirety of the electronics being assembled. For example, the transfer chamber 110 may be assembled and then cleaned using the remote plasma cleaning process described herein prior to any of the process chambers 116a-116c, load locks 120a, 120b and/or FI 106 being connected thereto. Similarly, any of process chambers 116a-116c may be cleaned using the remote cleaning process prior to connection to transfer chamber 110 and/or load locks 120a-120b may be cleaned prior to connection to transfer chamber 110. In another example, the load locks 120a, 120b may be connected to the transfer chamber 110, and the transfer chamber 110 and load locks 120a, 120b may be cleaned together using the remote plasma cleaning process described herein. The remote plasma cleaning process may also be separately performed on each of the process chambers 116a-116f. Alternatively, one or more of the process chambers 116a-116f may be connected to the transfer chamber 110, and the remote plasma cleaning process may be performed to clean the process chambers 116a-116f, the transfer chamber 110 and/or the load locks 120a, 120b together.

To perform the plasma cleaning process, a remote plasma system (RPS, also referred to as a remote plasma generator) 101 is connected to one of the chambers to be cleaned. The RPS 101 may be connected to the chamber at a window or port of the chamber, for example. All other windows and/or ports of the chamber may be sealed, and the interior of the chamber is pumped down to a vacuum. If any connected chambers are to be cleaned in the same cleaning process, then ports connecting the chamber to the other chambers may be opened for the cleaning process. In some embodiments, multiple RPSes 101 are connected to the chamber (or to more than one of the connected chambers), and each of the multiple RPSes delivers a remote plasma into the chambers.

In some embodiments, the interior of the chamber(s) is heated during the remote plasma cleaning process. Such heating may be performed using built-in heating elements of the chamber(s) in embodiments. Alternatively, a temporary heating system may be inserted into the chamber(s) and used to heat the interior of the chamber(s). In another embodiment, heating is performed by hot gas injection.

The RPS 101 is connected directly to a chamber to be cleaned (e.g., to transfer chamber 110) in embodiments, with no piping separating the RPS 101 from the chamber to which it is connected. This maximizes an efficiency of the cleaning process, and minimizes an amount of recombination of plasma radicals that may occur if the RPS is indirectly connected to the chamber (e.g., via intermediate piping). Alternatively, a minimal amount of piping may separate the RPS 101 from the chamber to which it is connected.

The RPS 101 may be positioned at the chamber to be cleaned in a manner that maximizes an efficiency of the cleaning. For example, if a transfer chamber 110 and connected load lock chambers 120a, 120b are to be cleaned together, then the RPS 101 may be connected to a port or window of the transfer chamber 110 that is at or near a side of the transfer chamber that is opposite a side of transfer chamber 110 to which the load lock chambers 120a, 120b are connected. This may ensure that a plasma flow direction 109 passes directly (or as near as possible) from the RPS 101 to both the transfer chamber 110 interior and to the load lock chamber 120a, 120b interiors (e.g., in a in an approximately straight line).

A specific range of gas mixtures, temperatures, process times and plasma powers may be used for the remote plasma cleaning process in embodiments, which are discussed in greater detail below.

Figure 2:
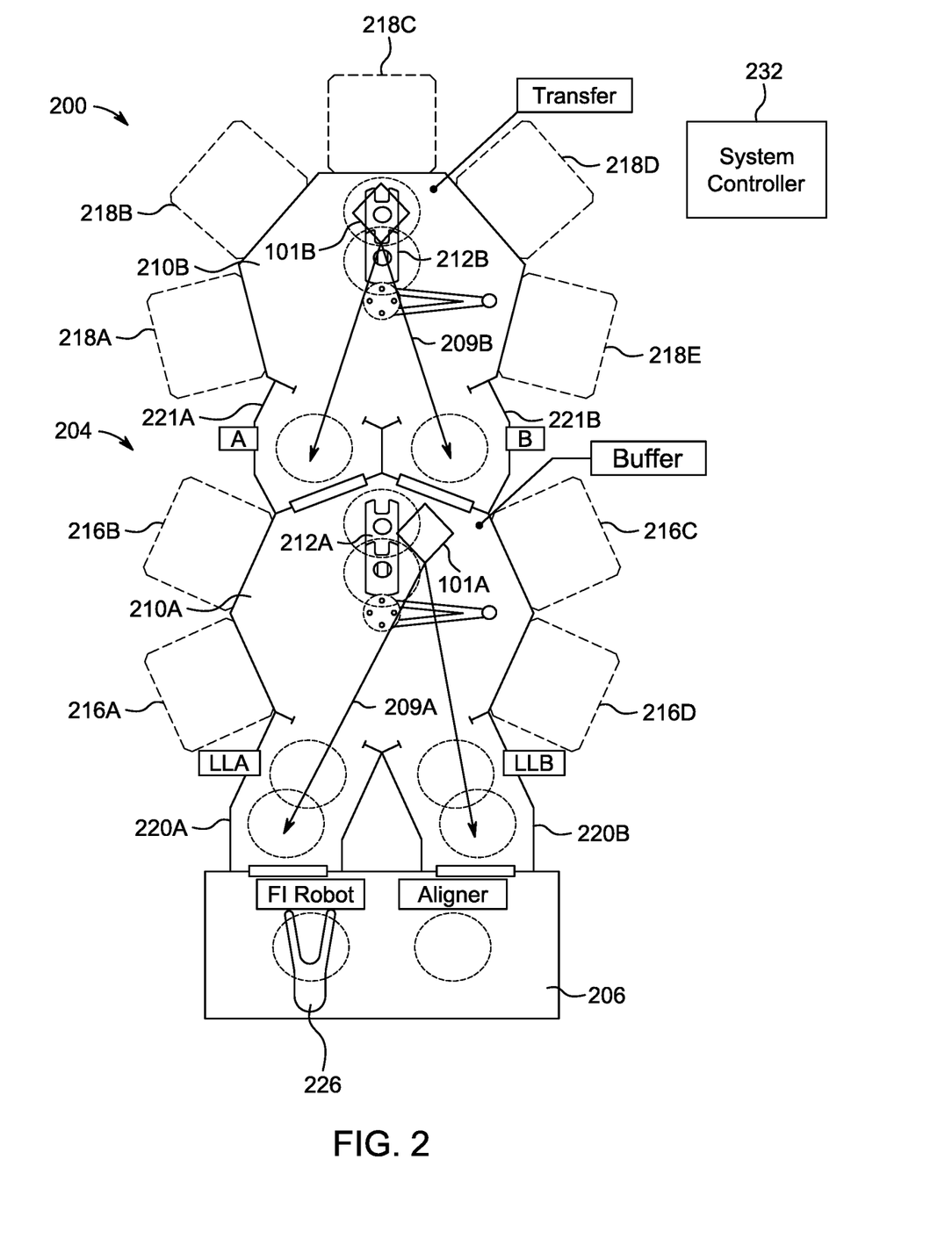
FIG. 2 is a top schematic view of an example electronics manufacturing system undergoing a remote plasma cleaning process, according to aspects of the present disclosure.

FIG. 2 is a top schematic view of an example electronics manufacturing system 200, according to one aspect of the disclosure. Electronics manufacturing system 200 may perform one or more processes on a substrate. Electronics manufacturing system 200 may include a mainframe 204 and a factory interface 206 coupled to mainframe 204. Mainframe 204 may include a first transfer chamber 210a and a second transfer chamber 210b connected to the first transfer chamber 210a via a first buffer chamber 221a and a second buffer chamber 221b. The mainframe 204 may additionally include a pair of load lock chambers 220a, 220b connected to the first transfer chamber 210a. The transfer chambers 210a, 210b, buffer chambers 221a, 221b and/or load lock chambers 220a, 220b may be subject to vacuum conditions during operation.

First transfer chamber 210a may include one or more processing chambers (also referred to as process chambers) 216a-216d disposed therearound and coupled thereto. Processing chambers 216a-216d may be coupled to transfer chamber 210a through respective ports, which may include slit valves or the like.

Second transfer chamber 210b may include one or more additional processing chambers 218a-218e disposed therearound and coupled thereto. Processing chambers 218a-218e may be coupled to transfer chamber 210b through respective ports, which may include slit valves or the like.

Note that the transfer chambers 210a, 210b having 8 sides (also referred to as facets) is shown, with a single processing chamber, load lock chamber or buffer chamber connected to each facet. However, it should be understood that a facet may include a single processing chamber or two or more processing chambers coupled thereto. Additionally, the transfer chambers may have other shapes, such as a rectangular shape (with four facets in which different facets may have different lengths), a square shape (with four facts in which all facets have approximately the same length) or a radial shape with a different number than eight facets (e.g., with five, six, or more facets).

Processing chambers 216a-216d and 218a-218e may be adapted to carry out any number of processes on substrates 202, as described above with reference to processing chambers 116a-116f, and may perform such operations under vacuum conditions.

Transfer chamber 210a and transfer chamber 210b may each include a transfer chamber robot 212a, 212b.

Factory interface (FI) 206 may be any suitable enclosure, such as, e.g., an Equipment Front End Module (EFEM). Factory interface 206 may be configured to receive substrates 202 from substrate carriers (not shown) docked at various load ports (not shown) of factory interface 206. A factory interface robot 226 may be configured to transfer substrates 202 between substrate carriers (also referred to as containers) and load locks 220a, 220b. Factory interface 206 may be maintained in, e.g., a slightly positive-pressure non-reactive gas environment (using, e.g., nitrogen as the non-reactive gas) in some embodiments.

In some embodiments, transfer chambers 210a, 210b, process chambers 216a-116d, 218a-218e, buffer chambers 221a, 221b, and load locks 220a, 220b may be maintained at a vacuum level. Electronics manufacturing system 200 may include one or more ports (e.g., vacuum ports) that are coupled to these chambers. Each of the ports may include slit valves that separate a vacuum environment from a higher pressure (e.g., atmospheric pressure) environment.

Electronics manufacturing system 200 may also include a system controller 232, which may be similar to system controller 132 of FIG. 1.

The electronics manufacturing system 200 (or one or more chambers thereof) may be cleaned using a remote plasma cleaning process in embodiments after assembly of the electronics manufacturing system 200. Alternatively, one or more chambers of the electronics manufacturing system 200 may be assembled and cleaned prior to an entirety of the electronics being assembled. For example, the transfer chamber 210a and load lock chambers 220a, 220b may be assembled and then cleaned together using the remote plasma cleaning process described herein. First RPS 101a may be connected to first transfer chamber 210a as shown to perform the remote plasma cleaning process. An example path 209a of the plasma is shown for such a cleaning process. In another example, the transfer chamber 210b and buffer chambers 221a, 221b may be assembled and then cleaned together using the remote plasma cleaning process described herein. Second RPS 101B may be connected to second transfer chamber 210b as shown to perform the remote plasma cleaning process. An example path 209a of the plasma is shown for such a cleaning process. In one embodiment, the valves separating first transfer chamber 210a from buffer chambers 221a, 221b are sealed during the remote plasma cleaning process, and the remote plasma cleaning processes using first RPS 101A and second RPS 101A are performed concurrently.

Figure 3:
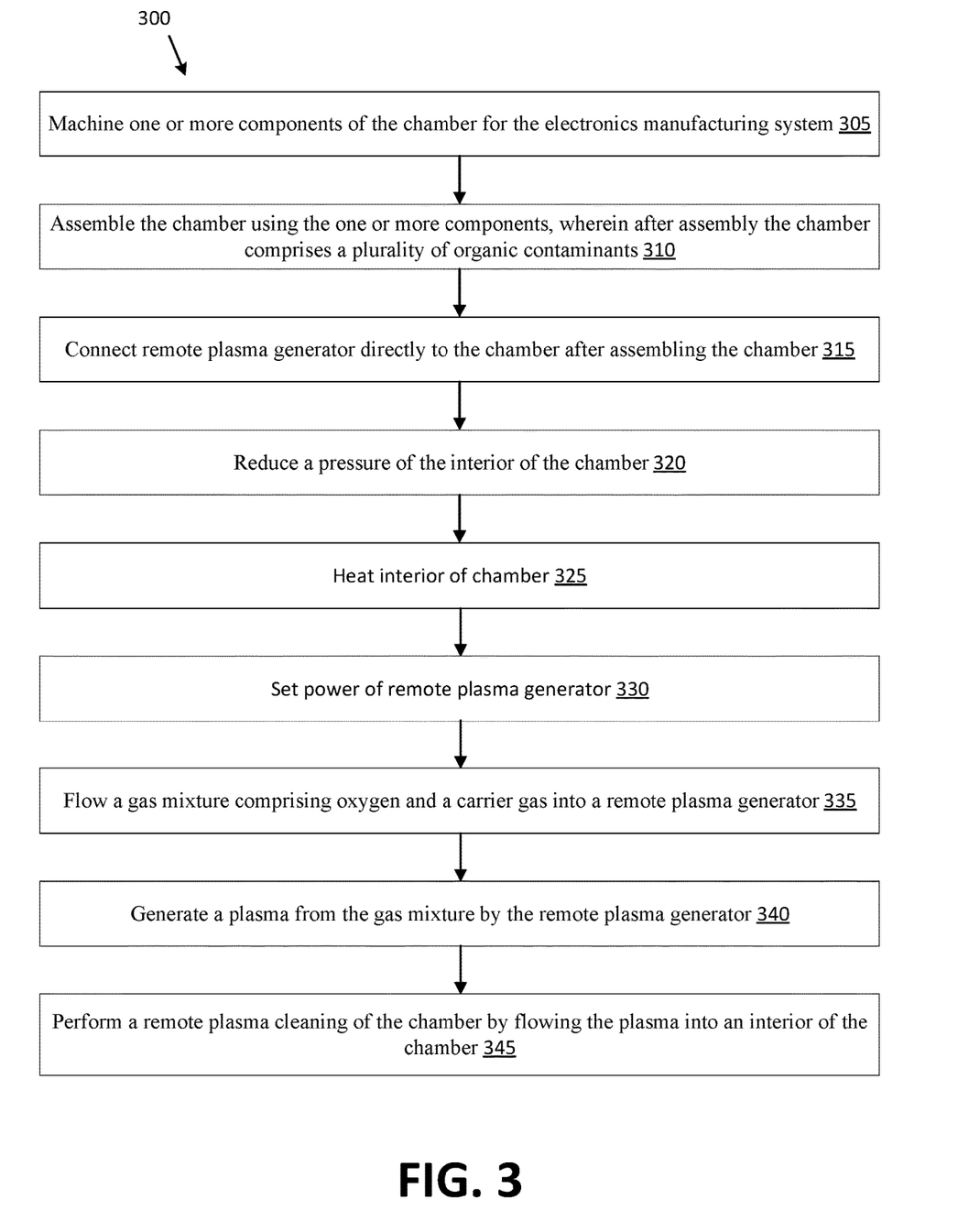
FIG. 3 is flow chart for a method of performing remote plasma cleaning of one or more chambers of an electronics processing system, according to embodiments of the present disclosure.

FIG. 3 is flow chart for a method 300 of performing remote plasma cleaning of one or more chambers and/or other assemblies of an electronics manufacturing system, according to embodiments of the present disclosure. Method 300 is discussed with reference to chambers, but the discussed operations can also be performed on other sealable assemblies such as FOUPs, SSPs, and so on. At block 305 of method 300, one or more components of a chamber (or of multiple chambers) of the electronics manufacturing system are machined. Such machining may include milling and/or polishing of the components, for example. At block 310, the chamber (or chambers) is assembled using the one or more components. Some or all of the components may include organic contaminants and/or AMCs such as aromatics, esters, phthalates, siloxane, plastics, rubbers, polymers, and so on. For example, one or more components of a chamber may include aromatic polyester, other polymers and/or esters, and/or other phthalates, which may be introduced by adhesives, lubricants, coatings, polymers (e.g., polymer based lubricants), volatile organic compounds and/or plastics used for and/or during packaging, sealing, lubricating, protecting, polishing, milling, etc. the components. Specific examples of some organic contaminants that may be present are polyethylene terephthalate (PET), polyethylene, polystyrene, polyurethane, dibutyl phthalate, siloxane, Benzoic acid, hydroxyl-ester, hydrocarbon, ketone, aldehyde, alcohol, ether, and dioctyl phthalate. Accordingly, the assembled chamber may include one or more of these organic contaminants as well.

At block 315, a remote plasma source/generator (RPS) is connected to the chamber after assembly of the chamber. The RPS is sealed to an opening of the chamber. In one embodiment, the remote plasma generator (RPS) is directly connected to the chamber without any piping disposed between an outlet of the remote plasma generator that outputs plasma and the chamber. In other embodiments, a short connector or piping is connected between the remote plasma generator and the chamber. The RPS may be connected to the chamber, for example, at a port or window of the chamber. Other ports and/or windows of the chamber may be sealed closed. In some instances, other chambers are connected to the chamber via one or more ports. Such ports may remain open during the remote plasma clean process.

At block 320, a pressure of an interior of the chamber (and optionally any other chambers connected to the chamber) may be reduced to achieve a vacuum. In an example, the chamber is reduced to a vacuum pressure of about 20-40 mTorr, or about 10-50 mTorr. Alternatively, the chamber(s) may be maintained at or around atmospheric pressure (e.g., at a pressure of about 80-100 Torr). In other embodiments, the interior of the chamber may be reduced to a pressure of anywhere between 10 mTorr to 100 Torr.

At block 325, the interior of the chamber (or multiple chambers) may be heated to a target temperature. In one embodiment, the target temperature is 30-120° C. In a further embodiment, the target temperature is 40-80° C. Temperatures above 40° C. have been shown to facilitate outgassing of organic contaminants and/or AMCs, speeding up the cleaning process. However, some materials such as o-rings or gaskets (e.g., heat and/or plasma resistant o-rings or gaskets) inside of chambers may include organic materials (e.g., additives) that are bound to other materials in the o-rings or gaskets. However, increasing the temperature above about 100° C. causes the organic materials to release from the o-rings or gaskets, increasing an amount of organic contaminants. Accordingly, in instance where such o-rings or gaskets are used, temperatures are maintained below 100° C., and in one embodiment below 80° C. In one embodiment, during a first time period the temperature is ramped up to a set temperature. The temperature is maintained at the set temperature for a second time period. After the second time period, the temperature is ramped down, for example, to room temperature during a third time period. In some embodiments, the interior of the chamber (or multiple chambers) is not heated.

In some embodiments, the chamber is maintained at the elevated temperature (e.g., of about 30-120° C.) for a duration before beginning to generate plasma. This may cause moisture in the chamber to evaporate prior to use of plasma. In one embodiment, the chamber is maintained at the elevated temperature for about 4-12 hours (e.g., about 8 hours) prior to flowing plasma into the chamber. In some embodiments, the heating of the chamber is performed under atmospheric pressure (e.g., prior to performing the operation of block 320).

At block 330, a power of the RPS is set. The power to which the RPS is set is dependent on a volume of the interior of the chamber(s) and/or a pressure of the interior of the chamber(s). In embodiments, the RPS is set to a power of about 50-500 Watts. In one embodiment, where the interior of the chamber is in vacuum (e.g., 20-40 mTorr or 10-50 mTorr) a low power setting of about 50 to about 110 Watts (e.g., around 80 Watts) is used for the RPS. In one embodiment, where the interior of the chamber is at or close to atmospheric pressure (e.g., at around 80-100 Torr), a higher power setting of about 400-600 Watts (e.g., around 500 Watts) is used.

At block 335, a gas mixture comprising oxygen and a carrier gas is flowed into the remote plasma generator. The gas mixture may be flowed into the RPS at a flow rate of about 5 sccm (standard cubic centimeter per minute) to about 100 sccm in embodiments. In one embodiment, the flow rate is about 5 sccm to about 50 sccm. The RPS may be connected to a single reservoir containing the mixed gas, or may be connected to multiple different gas reservoirs, and gases from the multiple reservoirs may be mixed in the RPS or in a delivery line to the RPS. In one embodiment, the gas mixture includes about 10-30 mol % oxygen and about 70-90 mol % of a carrier gas. The carrier gas is or includes a nonreactive gas such as nitrogen, argon, helium, or a combination thereof. In one embodiment, the gas mixture contains about 20 mol % oxygen and about 80 mol % of the carrier gas. In one embodiment, the mixed gas is clean air (e.g., which may include about 20 mol % $O_2$, about 79-80 mol % $N_2$ and optionally about 1 mol % of other gases).

Experimentation showed the unexpected results that using a gas mixture with a maximum of about 30 mol % oxygen resulted in improved cleaning performance as compared to gas mixtures with higher levels of oxygen. Theoretically, a plasma based on pure oxygen or a high molar percentage of oxygen should improve cleaning efficiency since there are more oxygen radicals that are available to interact with contaminants. However, experimentation showed that cleaning efficiency surprisingly decreased above oxygen concentrations of about 30 molar percent.

At block 340, the RPS generates a plasma from the gas mixture. At block 345, the plasma is delivered into the interior of the chamber(s) to perform a remote plasma cleaning of the interior of the chamber(s). In embodiments, the remote cleaning process is performed for a duration of about 5-15 hours. In other embodiments, the remote cleaning process may be performed for as few as 3 hours or for as many as 24 hours. The plasma may be delivered during one or more of the first, second, and third time periods described above. In some embodiments, the plasma is delivered while the chamber remains heated. The chamber may be heated to the same temperature that was used prior to flowing plasma into the chamber. Alternatively, the chamber may be heated to a different temperature than the temperature to which the chamber was heated prior to introducing the plasma. For example, a bakeout may be performed at block 325 at a first temperature, and a second temperature may be used at block 345. If the interior of the chamber is not heated, then the remote plasma cleaning process is performed for an increased amount of time, such as 16-24 hours, 36 hours, 2 days, or another duration. Once the remote plasma process is complete, the plasma is turned off, and any residual plasma, gases and/or reactants are evacuated from the interior of the chamber(s). Additionally, the chamber(s) are cooled to room temperature.

Method 300 may be performed at a site of a manufacturer of the electronics manufacturing system (e.g., of the chamber(s)) prior to shipment to a customer. Method 300 may additionally or alternatively be performed at a site at which the electronics manufacturing system will be installed (e.g., at a customer location). Method 300 may be performed prior to or after an electronics manufacturing system is fully assembled at the customer location (e.g., before or after an FI, load locks, transfer chamber and process chambers are connected together). In embodiments where method 300 is performed at the site at which the electronics manufacturing system will be installed, the operations of blocks 305 and 310 may be omitted. In some embodiments, the operations of FIG. 3 may be performed in the same or different order.

Figure 4:
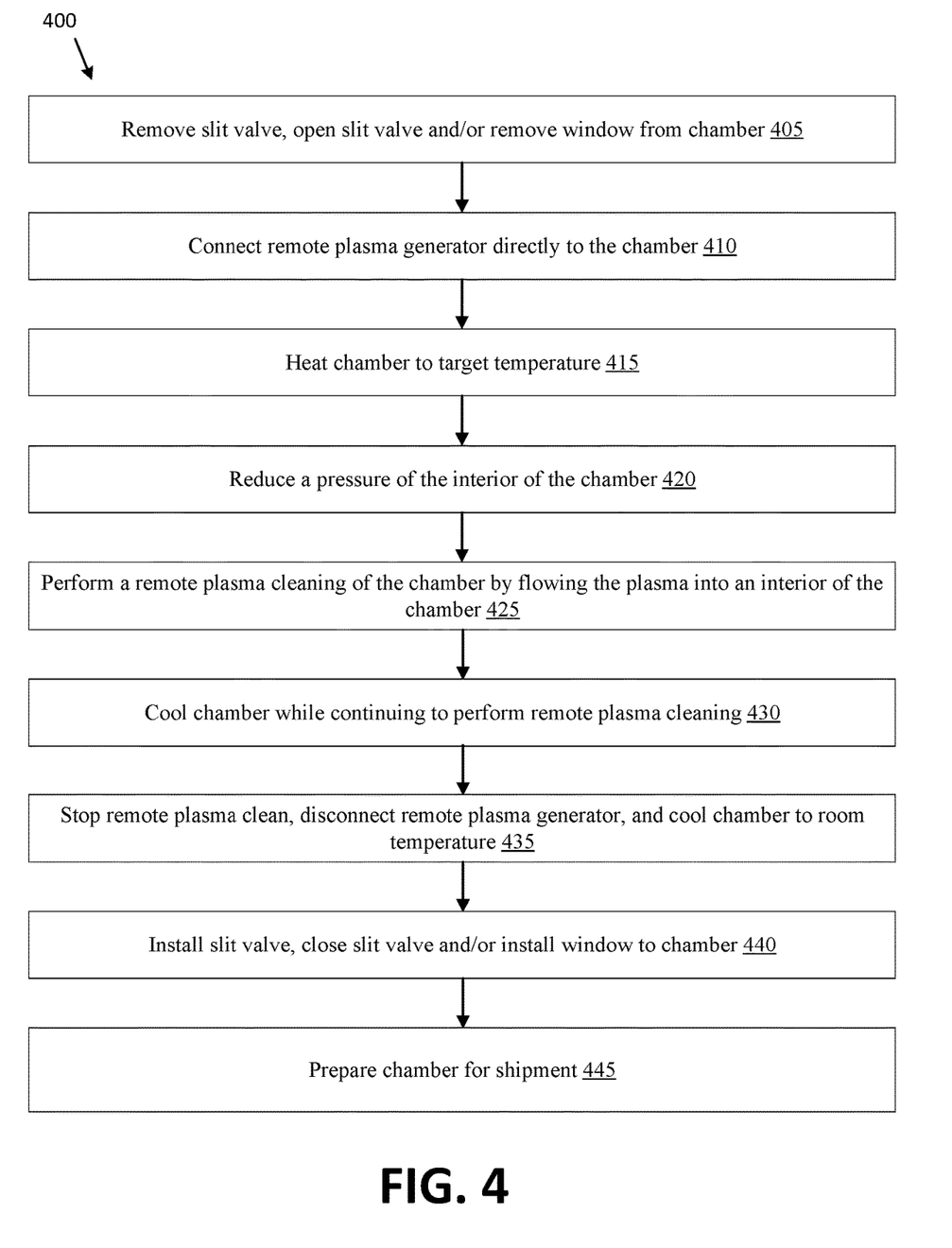
FIG. 4 is flow chart for a method of remote plasma cleaning one or more chambers of an electronics manufacturing system prior to shipment of the electronics manufacturing system, according to embodiments of the present disclosure.

FIG. 4 is flow chart for another method 400 of remote plasma cleaning one or more chambers of an electronics manufacturing system prior to shipment of the electronics manufacturing system, according to embodiments of the present disclosure. Method 400 is discussed with reference to chambers, but the discussed operations can also be performed on other sealable assemblies such as FOUPs, SSPs, and so on. At block 405 of method 400, an opening is generated in a chamber to enable a flow of plasma to enter an interior of the chamber. The opening may be generated by removing a window or slit valve from the chamber. Alternatively, the opening may be generated by opening a slit valve of the chamber.

At block 410, a remote plasma source/generator (RPS) is connected to the chamber after assembly of the chamber. The RPS is sealed to an opening of the chamber at the opening that was generated (e.g., at a location of a port at which a slit valve was opened or removed, or at a location of a window that was removed). In one embodiment, the remote plasma generator (RPS) is directly connected to the chamber without any piping disposed between an outlet of the remote plasma generator that outputs plasma and the chamber. In other embodiments, a short connector or piping is connected between the remote plasma generator and the chamber.

At block 415, the interior of the chamber may be heated to a target temperature. In one embodiment, the target temperature is 30-120° C. In a further embodiment, the target temperature is 40-80° C. In one embodiment, during a first time period the temperature is ramped up to a set temperature. The temperature is maintained at the set temperature for a second time period. After the second time period, the temperature is ramped down, for example, to room temperature during a third time period.

In some embodiments, the chamber is maintained at the elevated temperature (e.g., of about 30-120° C.) for a duration before beginning to generate plasma. This may cause moisture in the chamber to evaporate prior to use of plasma. In one embodiment, the chamber is maintained at the elevated temperature for about 4-12 hours (e.g., about 8 hours) prior to flowing plasma into the chamber. In some embodiments, the heating of the chamber is performed under atmospheric pressure (e.g., prior to performing the operation of block 320) prior to beginning the operations of block 420. Alternatively, the operations of block 420 may be performed in parallel to those of block 415.

At block 420, a pressure of an interior of the chamber (and optionally any other chambers connected to the chamber) may be reduced to achieve a vacuum. In an example, the chamber is reduced to a vacuum pressure of about 20-40 mTorr, or about 10-50 mTorr. Alternatively, the chamber(s) may be maintained at or around atmospheric pressure (e.g., at a pressure of about 80-100 Torr). In other embodiments, the interior of the chamber may be reduced to a pressure of anywhere between 10 mTorr to 100 Torr.

At block 425, the RPS generates a plasma from the gas mixture and the plasma is delivered into the interior of the chamber(s) to perform a remote plasma cleaning of the interior of the chamber(s). In embodiments, the remote cleaning process is performed for a duration of about 5-15 hours. In other embodiments, the remote cleaning process may be performed for as few as 3 hours or for as many as 24 hours. The plasma may be delivered during one or more of the first, second, and third time periods described above. In some embodiments, the plasma is delivered while the chamber remains heated. The chamber may be heated to the same temperature that was used prior to flowing plasma into the chamber. Alternatively, the chamber may be heated to a different temperature than the temperature to which the chamber was heated prior to introducing the plasma. If the interior of the chamber is not heated, then the remote plasma cleaning process is performed for an increased amount of time, such as 16-24 hours, 36 hours, 2 days, or another duration.

In one embodiment, at block 430 the process chamber is cooled while continuing to perform the remote plasma cleaning. In one embodiment, this is performed for a duration of about 1-3 hours (e.g., about 2 hours). Alternatively, block 430 may be skipped. At block 435, the remote plasma clean is stopped, the RPS is disconnected from the chamber, and the chamber is cooled to room temperature.

At block 440, the previously removed slit valve or window is reinstalled on the chamber. Alternatively, the slit valve that was opened may be closed. At block 445, the chamber is prepared for shipment (e.g., to a customer).

Figure 5:
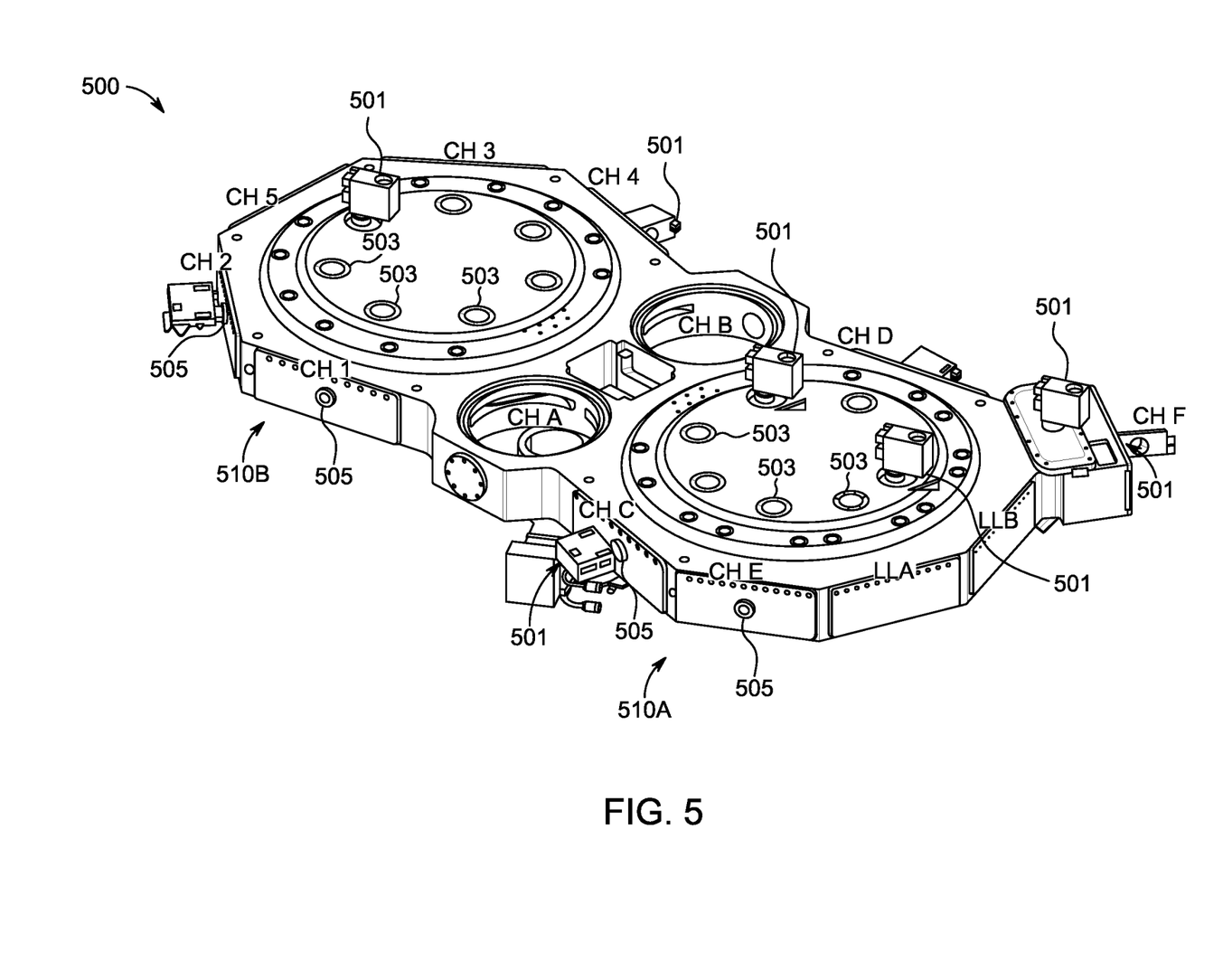
FIG. 5 illustrates possible locations of an electronics manufacturing system to which a remote plasma source may be connected to perform remote plasma cleaning of one or more chambers of the electronics manufacturing system.

FIG. 5 illustrates multiple possible locations of an electronics manufacturing system 500 to which a remote plasma source 501 may be connected to perform remote plasma cleaning of one or more chambers of the electronics manufacturing system 500. The electronics processing system 500 of FIG. 5 corresponds to electronics processing system 200 of FIG. 2. As shown, the transfer chambers 510A-510B of the electronics manufacturing system 500 each includes multiple windows 503. Any of these windows 503 may be temporarily removed to provide access to an interior of the transfer chamber 510A-510B, and the RPS module 501 may be connected to the window 503. Additionally, or alternatively, the transfer chambers 510A-510B include multiple ports 505, and an RPS module 501 may be connected to the transfer chamber 510A-510B via any of the ports 505. In some embodiments, a slit valve is removed from a port 505 prior to connecting the RPS module 501 to that port. In other embodiments, the port 505 is opened (e.g., by opening the slit valve) to provide a pumping path, and the RPS module 501 is connected via the open port. Multiple RPS modules 501 may be connected to one or both of the transfer chambers 510A-510B at the same time to perform plasma cleaning. Alternatively, a single RPS module 501 may be connected to one or both of the transfer chambers 510A-510B.

Multiple flow simulation conditions were tested for simulation of a remote plasma cleaning process on one or more chambers of an electronics manufacturing system. Under the simulation conditions, any chamber port or window of a chamber is available for mounting an RPS module to. Simulation boundary conditions of a clean dry air (CDA) flow rate of 10 sccm, an $O_2$ dissociation rate of about 80%, and a pressure of 1E-2 Torr were tested. A composition of the clean dry air was measured to be about 20.95% $O_2$ and 79.05% $N_2$. A reaction model of $O+O=O_2$ with a sticking coefficient of 1e-4 was tested. For the boundary conditions, a steady state simulation was used with an operating pressure of 0.01 Torr, a viscosity of 3.5e-6, a mesh size of 1.3 million nodes, and a simulated chemistry of $N_2$, $O_2$ and O. Simulated reactions include:

$O+O+O_2 \rightarrow 2O_2$, e.g., for $k=7.4 \cdot 10^{-33}$ cm$^6$s$^{-1}$ $O+O_2+O_2 \rightarrow O_2+O_3$, e.g., for $k=6 \cdot 10^{-34}$ cm$^6$s$^{-1}$ $O+O_3 \rightarrow 2O_2$, e.g., for $k=9 \cdot 10^{-15}$ cm$^6$s$^{-1}$ $O+O+W \rightarrow W+O_2$, e.g., for $\alpha=0.1-0.002$ Where k is a reaction rate constant and $\alpha$ is a sticking coefficient. Additionally, for the equation $O+O+W \rightarrow W+O_2$, e.g., for $\alpha=0.1-0.002 \cdot W$ represents a wall or surface, and the equation means that when an O radical impacts the wall, it has 10%-0.2% chance to be converted to $O_2$.

Simulation showed complete removal of organic contaminants.

Figure 6A:
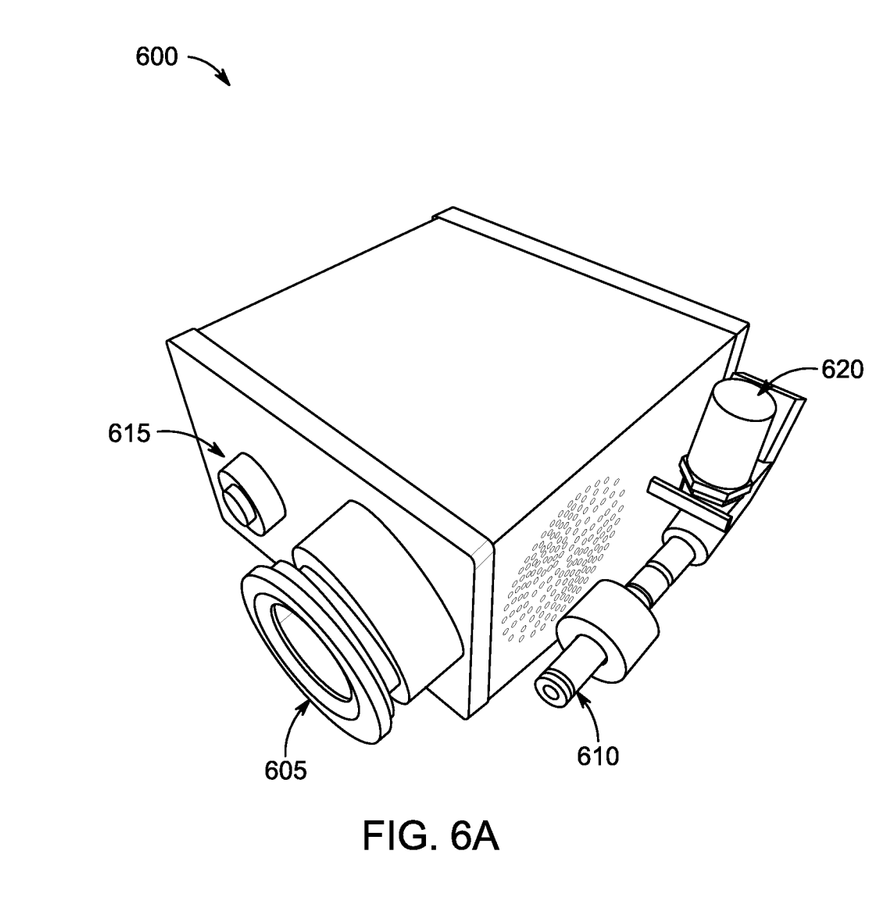
FIG. 6A illustrates an example remote plasma generator.

FIG. 6A illustrates an example remote plasma source/generator (RPS) module 600, which may correspond to RPS 101, 101a, 101b, 501 described above. The RPS module 600 includes a knob 615 to adjust a plasma power, a port (e.g., a KF40 port) that can seal to a port or window of a chamber), a gas feed line (which may include a filter) 610 and a gas flow control 620 that can control a gas flow rate into the RPS module 600. In one embodiment, the RPS module 600 is a low power unit capable of achieving powers of 1-100 Watts. The small size of the RPS module 600 and the port 605 enables the RPS module 600 to attach to any mainframe (e.g., transfer chamber) or chamber body. The gas feed line and filter 610 allows for the use of different plasma chemistries.

Figure 6B:
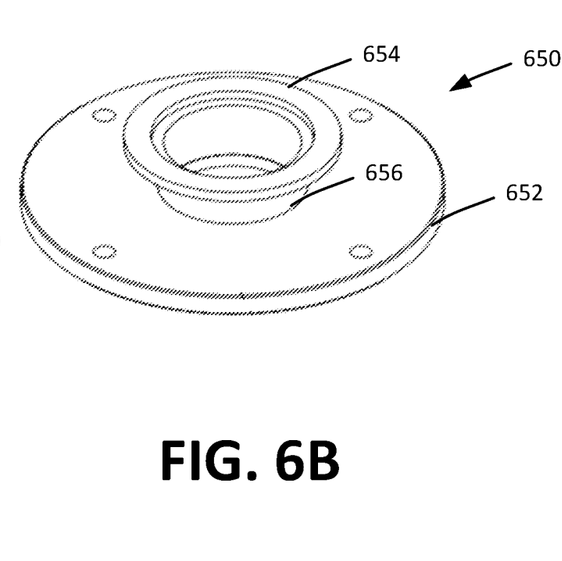
FIG. 6B illustrates an adapter for connecting a remote plasma generator to a chamber.

FIG. 6B illustrates an adapter 650 for connecting an RPS module to a chamber. The adapter 650 may include a base 652 that connects to a chamber, a ring or flange 654 that connects to the RPS module, and a tube or cylinder 656 that connects the base 652 to the ring 654. The base 652 may be disc shaped, and may include an outer diameter corresponding to a diameter of a transfer chamber window in embodiments and an inner diameter corresponding to an inner diameter of the tube or cylinder 656. The ring or flange 654 may have a smaller outer diameter than the base 652 in embodiments. The tube or cylinder 656 may be a radical conductance tube, and may have a diameter and length that controls a rate of radicals that reach a chamber from an RPS module. In one embodiment, the tube or cylinder 656 has a length of about 1 inch to minimize a separation between the remote plasma generator (RPS module) and the chamber to which it is connected. The short length of about 1 inch or less provides increased conductance and higher cleaning rates as opposed to a longer length of the tube or cylinder 656. The adapter 650 enables the RPS module to connect to a window port or load port of the chamber in embodiments.

Figure 7:
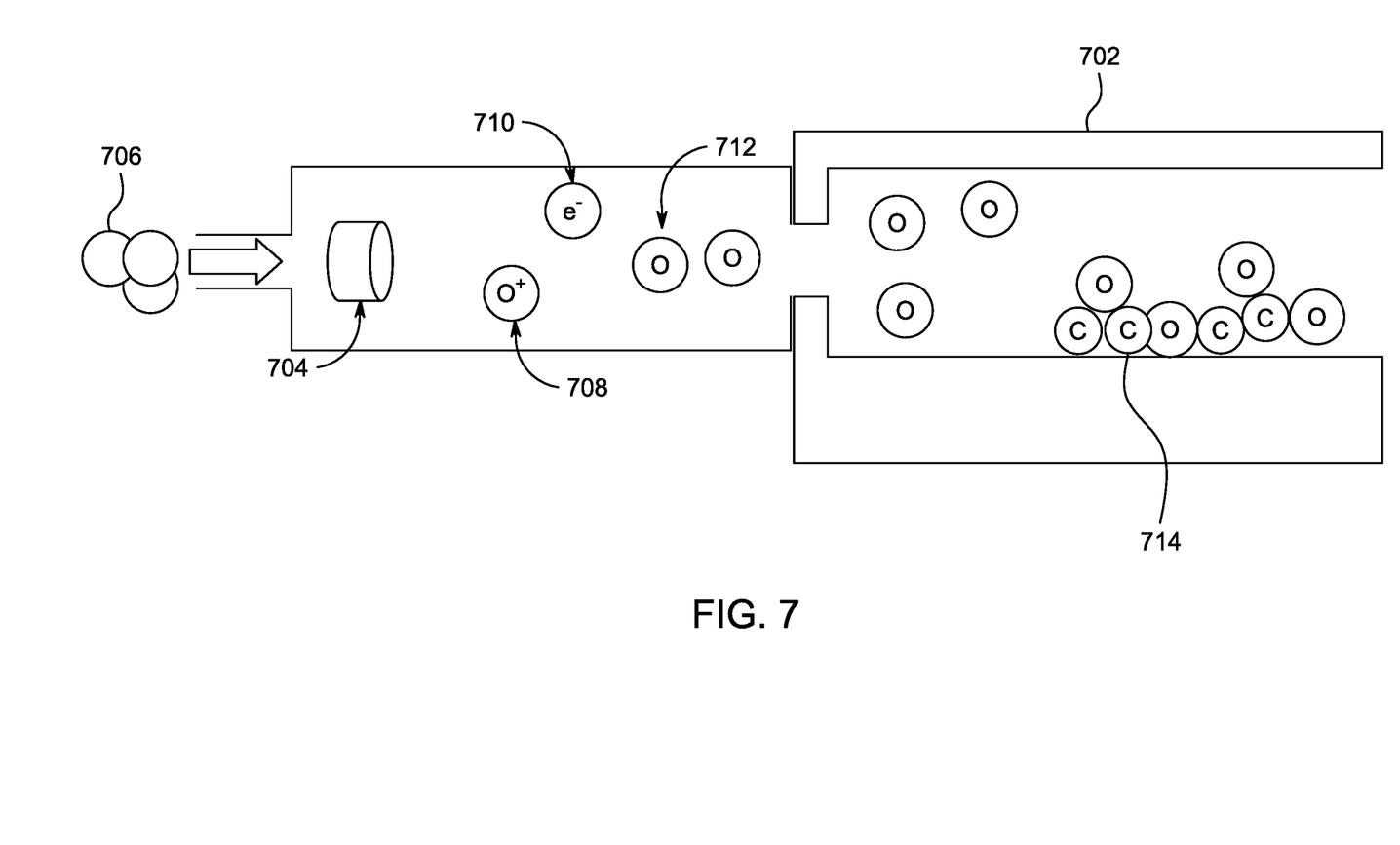
FIG. 7 illustrates working principles of carbon removal using a remote plasma cleaning process.

FIG. 7 illustrates working principles of carbon removal using a remote plasma cleaning process with gas mixture of oxygen and a carrier gas. As shown, a plasma generator 704 receives a flow of $O_2$ molecules 706 (a gas such as clean dry air containing $O_2$) and generates a plasma including $O^+$ ions 708, electrons 710, and O radicals 712. The plasma is pumped into a chamber 702, and the O radicals 712 interact with carbon 714 on surfaces of the chamber to form $CO_2$ according to the equation $2O+C \rightarrow CO_2$. The $CO_2$ gas is then pumped out of the chamber. Surfaces of the chamber may additionally include contamination of long chain hydrocarbons, which may react with the O radicals of the oxygen plasma according to the equation $C_xH_y+O \rightarrow CO_2+H_2O$. The $H_2O$ may evaporate if the chamber is heated. The $CO_2$ and evaporated $H_2O$ may then be pumped out of the chamber 702.

In one embodiment, a test setup was used to measure cleaning of organic contaminants using a remote plasma cleaning process. For the test setup, a quartz crystal monitor (QCM) deposited with amorphous carbon was used to measure a carbon (C) removal rate as a function of plasma power. The Sauerbrey question was used to determine the frequency to mass/area (thickness) relationship, as follows:

$$\Delta f = -\frac{2f_0^2}{A\sqrt{\rho_q \mu_q}} \Delta m$$

Where $f_0$ is the resonant frequency of the fundamental mode (in Hz), $\Delta f$ is normalized frequency change (in Hz), $\Delta m$ is mass change (in g), A is the piezoelectrically active crystal area between electrodes of the quartz crystal monitor (in cm$^2$), $\rho_q$ is the density of quartz (2.648 g/cm 3), and $\mu_q$ is the shear modulus of quarts for an AT-cut crystal (2.947×10$^{11}$ gcm$^{-1}$s$^{-2}$). In one embodiment, test conditions included Au and Ag electrodes for the quartz crystal monitor, an initial carbon thickness of 500 angstroms, a driving gas of air, and a pressure of 5E-3 Torr. Test results showed removal rates commensurate with those shown in FIGS. 8-9.

In one embodiment, a test was performed using contaminated coupons in a transfer chamber. An RPS module was attached to a port of the transfer chamber. A first contaminated coupon that included organic contamination was placed near the port with the attached RPS module. A second contaminated coupon that included organic contamination was placed as far as possible from the port with the attached RPS module. Prior to cleaning using the remote plasma cleaning process described herein, the first coupon contamination levels were measured to be over 200,000 particles, and the second coupon contamination levels could not be measured due to saturating test equipment (too many particles to measure). A remote plasma cleaning process was performed using a gas including 78% $N_2$, 21% $O_2$ and 1% additional gases, a plasma power of 80 W, a cleaning time of 24 hours, room temperature, and a pressure range of 2-4 mTorr. After the remote plasma cleaning process, zero organic contamination was measured on the first coupon and two particles were measured on the second coupon. Accordingly, the organic contamination was essentially completely eliminated using the remote plasma cleaning process. Tests were also run using a remote plasma cleaning process with a plasma power of 80 W, a duration of 30 minutes, a plasma generated from clean air, and various temperatures to yield a greater than 99% cleaning efficiency (over 99% of initial contamination was removed).

After repeated tests, experimentation showed that the remote plasma cleaning process described in embodiments removed all on-wafer organic contaminants on wafers placed in tested chambers using a temperature of 50 degrees C. and a cleaning duration of 8-14 hours. The tests were performed on the electronics manufacturing system 200 shown in FIG. 2 as well as other electronics manufacturing systems not illustrated herein. Measured contaminants at load lock 220a, load lock 220b, transfer chamber 210a, transfer chamber 210b, first buffer 221a and second buffer 221b were all reduced to a measurable contamination of 0 detected particles or areas of contamination. Starting measured contamination ranged from about a few areas of contamination/particles, to too large a number of areas of contamination/particles to distinguish from one another.

Figure 8:
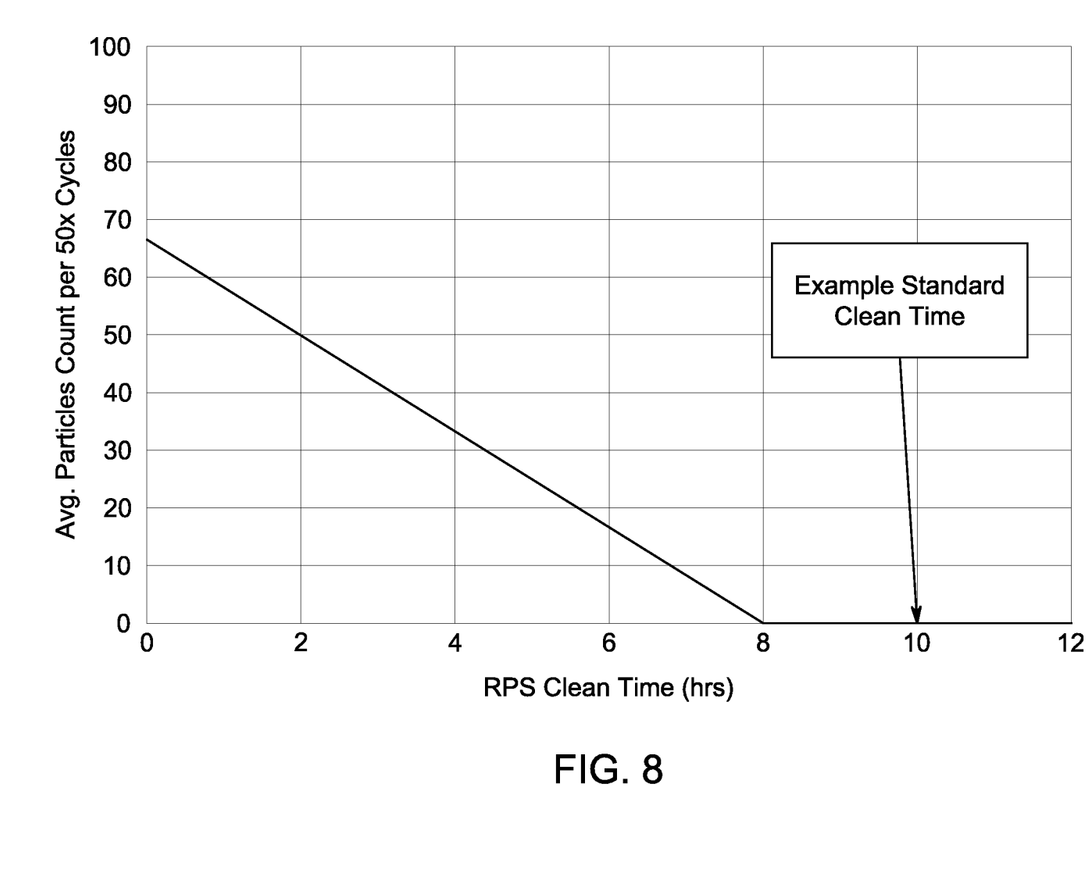
FIG. 8 illustrates test results for remote plasma cleaning, according to embodiments of the present disclosure.

FIG. 8 illustrates test results for remote plasma cleaning, according to embodiments of the present disclosure. In FIG.

8 the x-axis represents RPS clean time in hours, and the y-axis represents an average particle count for organic particles per 50 cycles. Initially, the particle count was around 66, and there was an approximately linear reduction in the particle count until 100% reduction in particles was achieved after 8 hours. As shown, the total number of detected organic particles that were detected was reduced to 0 after a clean time of 8 hours. For the test, the gas used to generate the plasma was ambient cleanroom air, a plasma power of 80 W was used, and a pressure range of 20-40 mTorr was used. The illustrated chart shows the average particle count on the y-axis and the remote plasma clean time on the x-axis. As shown, the plasma clean completely eliminated organic contamination at 8 hours. For the test, the chamber was heated to an elevated temperature for 8 hours prior to performing the remote plasma cleaning process. An example standard clean recipe may run for approximately 10 hours. Thus, detection of complete elimination of particles at 8 hours shows that cleaning was able to end 2 hours early.

Figure 9:
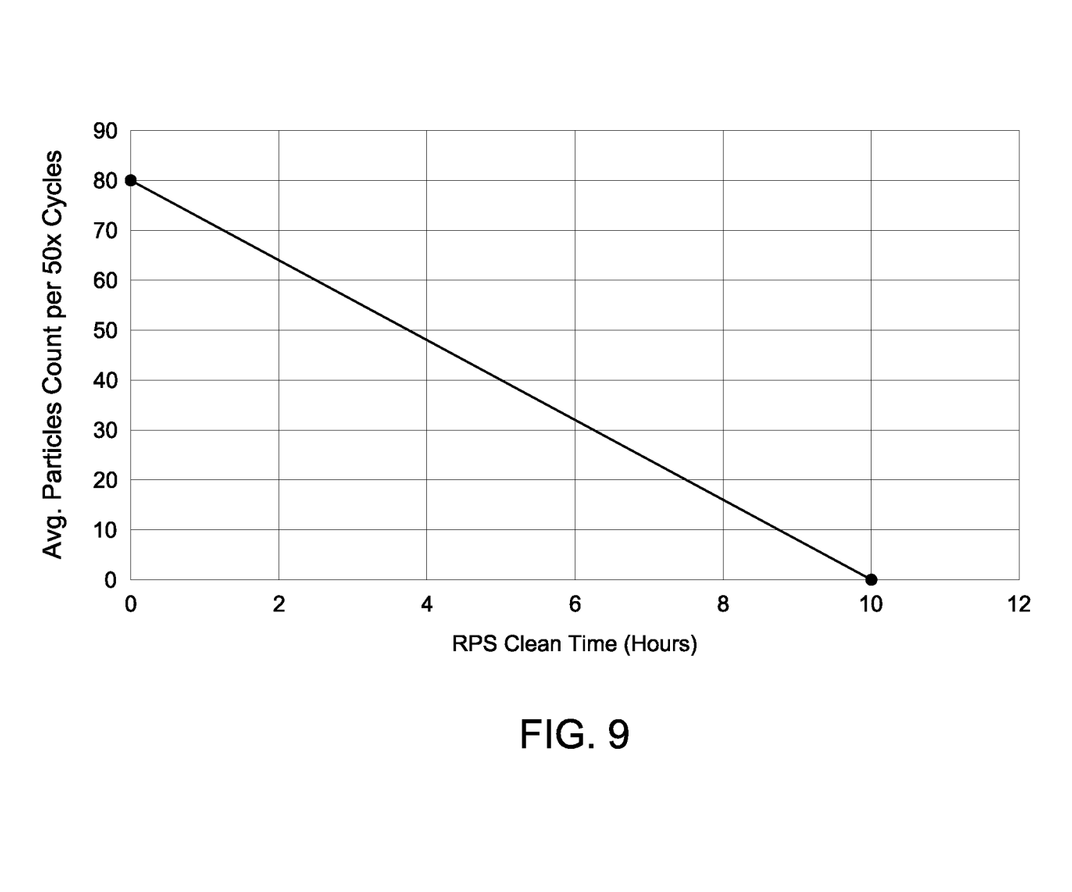
FIG. 9 illustrates test results for remote plasma cleaning, according to embodiments of the present disclosure.

FIG. 9 illustrates test results for remote plasma cleaning, according to embodiments of the present disclosure. The illustrated chart shows the average particle count on the y-axis (per 50 cycles) and the remote plasma clean time on the x-axis (in hours). As shown, the total number of detected organic particles that were detected was reduced to 0 after a clean time of 10 hours. Initially, about 80 defects were detected. After 10 hours of cleaning, 0 defects were detected.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method may be altered so that certain operations may be performed in an inverse order so that certain operations may be performed, at least in part, concurrently with other operations. In another embodiment, instructions or suboperations of distinct operations may be in an intermittent and/or alternating manner.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method of cleaning a transfer chamber for an electronics manufacturing system, comprising:
flowing a gas mixture comprising oxygen and a carrier gas into a remote plasma generator;
generating a plasma from the gas mixture by the remote plasma generator; and
performing a remote plasma cleaning of the transfer chamber by flowing the plasma into an interior of the transfer chamber, the transfer chamber comprising a plurality of ports, wherein substrates are transferred through the transfer chamber and through the plurality of ports, and wherein the plasma removes a plurality of organic contaminants from the transfer chamber.

2. The method of claim 1, further comprising:
reducing a pressure of the interior of the transfer chamber to a vacuum pressure of about 10-50 mTorr, wherein the remote plasma cleaning is performed at the pressure of about 10-50 mTorr; and
setting a power of the remote plasma generator to about 50-110 Watts, wherein the plasma is generated at the power of about 50-110 Watts.

3. The method of claim 1, further comprising:
setting a power of the remote plasma generator to about 50-500 Watts, wherein the plasma is generated at the power of about 50-500 Watts.

4. The method of claim 1, further comprising:
causing a pressure of the interior of the transfer chamber to reach about 80-100 Torr, wherein the remote plasma cleaning is performed at the pressure of about 80-100 Torr; and
setting a power of the remote plasma generator to about 400-600 Watts, wherein the plasma is generated at the power of about 400-600 Watts.

5. The method of claim 1, further comprising:
heating the interior of the transfer chamber to a temperature of about 30-120° C., wherein the remote plasma cleaning is performed at the temperature of about 30-120° C.

6. The method of claim 1, wherein the remote plasma cleaning is performed for a duration of about 5-15 hours.

7. The method of claim 1, wherein the gas mixture is clean air.

8. The method of claim 1, wherein the gas mixture comprises about 10-30 mol % oxygen and about 70-90 mol % of the carrier gas.

9. The method of claim 8, wherein the carrier gas is a nonreactive gas selected from a group consisting of argon, nitrogen and helium.

10. The method of claim 1, wherein the transfer chamber is coupled to at least one of a load lock chamber or a process chamber, wherein a gate separating the transfer chamber from at least one of the load lock chamber or the process chamber is open during the remote plasma cleaning, and wherein the remote plasma cleaning is additionally performed for at least one of the load lock chamber or the process chamber by flowing the plasma into the interior of the transfer chamber.

11. The method of claim 1, wherein the gas mixture is flowed into the remote plasma generator at a flow rate of about 5 sccm to about 100 sccm.

12. The method of claim 1, wherein the transfer chamber is configured to include a robot arm that transfers the substrates through the transfer chamber and through the plurality of ports.

13. An electronics processing system, comprising:
- a transfer chamber comprising a plurality of ports, wherein substrates are transferred through the transfer chamber and through the plurality of ports;
- a plurality of process chambers connected to the transfer chamber via the plurality of ports; and
- a remote plasma source connected to the transfer chamber, wherein the remote plasma source is to:
  - receive a gas mixture comprising oxygen and a carrier gas;
  - generate a plasma from the gas mixture; and
  - provide the plasma to an interior of the transfer chamber to perform a remote plasma cleaning of the transfer chamber, wherein the plasma is to remove a plurality of organic contaminants from the transfer chamber.

14. The electronics processing system of claim 13, further comprising:
- a vacuum system to reduce a pressure of the interior of the transfer chamber to a vacuum pressure of about 10-50 mTorr, wherein the remote plasma cleaning is to be performed at the pressure of about 10-50 mTorr and at a power of about 50-110 Watts.

15. The electronics processing system of claim 13, wherein the remote plasma cleaning is to be performed at a power of about 50-500 Watts.

16. The electronics processing system of claim 13, wherein the remote plasma cleaning is to be performed at a pressure of about 80-100 Torr and at a power of about 400-600 Watts.

17. The electronics processing system of claim 13, further comprising:
- a heater connected to the transfer chamber or in the transfer chamber, wherein the heater is to heat the interior of the transfer chamber to a temperature of about 30-120° C., wherein the remote plasma cleaning is to be performed at the temperature of about 30-120° C., and wherein the remote plasma cleaning is to be performed for a duration of about 5-15 hours.

18. The electronics processing system of claim 13, wherein the gas mixture comprises about 10-30 mol % oxygen and about 70-90 mol % of the carrier gas.

19. The electronics processing system of claim 13, further comprising:
- a load lock chamber connected to the transfer chamber, wherein a gate separating the transfer chamber from the load lock chamber is to be opened during the remote plasma cleaning, and wherein the remote plasma cleaning is additionally performed for the load lock chamber by flowing the plasma into the interior of the transfer chamber.

20. The electronics processing system of claim 13, further comprising:
- a gate separating the transfer chamber from a process chamber of the plurality of process chambers, wherein the gate is to be opened during the remote plasma cleaning, and wherein the remote plasma cleaning is additionally performed for the process chamber by flowing the plasma into the interior of the transfer chamber.

* * * * *